United States Patent
Shen et al.

(10) Patent No.: US 11,297,430 B2
(45) Date of Patent: Apr. 5, 2022

(54) TERMINAL DEVICE, APPARATUS AND METHOD FOR SIMULATING THE CHARACTERISTIC OF AN AUDIO PROCESSOR, AND COMPUTER-READABLE STORAGE MEDIUM

(71) Applicant: SHENZHEN MOOER AUDIO CO., LTD., Shenzhen (CN)

(72) Inventors: Ping Shen, Shenzhen (CN); Zhenyu Tang, Shenzhen (CN); Jianxiong Zhang, Shenzhen (CN)

(73) Assignee: SHENZHEN MOOER AUDIO CO., LTD., Shenzhen (CN)

( * ) Notice: Subject to any disclaimer, the term of this patent is extended or adjusted under 35 U.S.C. 154(b) by 204 days.

(21) Appl. No.: 16/719,973

(22) Filed: Dec. 18, 2019

(65) Prior Publication Data

US 2021/0105561 A1 Apr. 8, 2021

(30) Foreign Application Priority Data

Oct. 8, 2019 (CN) .......................... 201910948353.7

(51) Int. Cl.
| | |
|---|---|
| H04R 3/04 | (2006.01) |
| G06F 30/20 | (2020.01) |
| G06F 17/14 | (2006.01) |
| G10L 21/0232 | (2013.01) |

(52) U.S. Cl.
CPC ............... *H04R 3/04* (2013.01); *G06F 17/14* (2013.01); *G06F 30/20* (2020.01); *G10L 21/0232* (2013.01)

(58) Field of Classification Search
CPC ..... G06F 17/14; G06F 30/20; G10L 21/0232; H04R 29/001; H04R 3/04; H04S 7/308
USPC .......................................................... 381/98
See application file for complete search history.

(56) References Cited

U.S. PATENT DOCUMENTS

| | | | |
|---|---|---|---|
| 2017/0024495 A1* | 1/2017 | Wang | G06F 17/11 |
| 2018/0152781 A1* | 5/2018 | Boyer | H03G 3/14 |

* cited by examiner

*Primary Examiner* — Paul Kim
*Assistant Examiner* — Friedrich Fahnert
(74) *Attorney, Agent, or Firm* — Cheng-Ju Chiang (57) ABSTRACT

The present disclosure provides a method and an apparatus for simulating the sound characteristics of the audio processor, a terminal device and a storage medium. The method simulates the sound characteristic of a target audio processor by constructing a nonlinear model. The nonlinear model consists of a pre-filter, a saturation characteristic curve, and a post-filter. A high-level signal is sent to the target sound processor, and the target sound processor correspondingly sends out the first output signal, and then the first output signal is filtered and performed spectrum analysis to acquire the frequency response of the post-filter; And a low-level signal is sent to the target sound processor, and the target sound processor correspondingly sends out the second output signal, and then the second output signal is filtered and performed spectrum analysis to obtain a frequency response product of the pre-filter and the post-filter.

20 Claims, 4 Drawing Sheets

TERMINAL DEVICE, APPARATUS AND METHOD FOR SIMULATING THE CHARACTERISTIC OF AN AUDIO PROCESSOR, AND COMPUTER-READABLE STORAGE MEDIUM

CROSS-REFERENCE TO RELATED APPLICATIONS

This application claims the benefit of priority to Chinese Patent Application No. 201910948353.7 titled "terminal device, apparatus and method for simulating the characteristic of an audio processor, and computer-readable storage medium", filed with the China State Intellectual Property Office on Oct. 8, 2019, the disclosures of which are hereby incorporated by reference in their entirety.

TECHNICAL FIELD

The present invention relates to the field of audio technology, and more particularly to a method for simulating the characteristic of an audio processor, a terminal device and an apparatus for simulating the characteristics of an audio processor, and a computer-readable storage medium.

BACKGROUND

In the audio technology field, audio processors are usually used to generate different sound effects, resulting increase the expressiveness and power of the music. Such as, guitar speakers, effects, amplifiers, mixers, vacuum tube power amplifiers and so on. Generally, these kinds of equipment are large and bulky, it is not convenient for musicians to carry out when performing, and because these equipment are expensive, it is usually impossible for an ordinary consumer to purchase several different audio processors to achieve the corresponding sound effect. Currently, if the musician want to achieve several different sound effects, it is a wise choice for musicians to use analog devices that can simulate the sound characteristics of various audio processors.

In the case of guitar speakers, guitar speakers are made for guitars (including electric guitars and acoustic guitars). For a guitarist, a good guitar speaker is as important as a good guitar, because no matter how expensive the guitar is, it would be a dumb without a guitar speaker. However, in some cases, such as the performance site, the guitar speaker may not be provided or even though the sponsor provide the guitar speaker, because the device is used for a long time and aging, the sound quality is not satisfactory. And since the guitar speaker is bulky, it is also inconvenient for the musicians to carry out his own guitar speaker to the performance every time.

In addition, a good speaker is expensive. For those who need a variety of other speaker sounds, the cost of purchasing multiple speakers is undoubtedly high. Therefore, in the prior art, there is a speaker simulation that can simulate various speaker sounds. The existing speaker simulation equipment mostly adopts the frequency response fitting technology. That is, firstly, finding the speaker with similar distortion sound as the source speaker; secondly, analyzing the difference of the frequency response between the source speaker and the target speaker, and compensate the difference of the frequency response, to achieve that the sound of the source speaker is close to the sound of the target speaker. This analog method is a linear simulation method. It can't simulate the distortion sound of the speaker, that is, it can't simulate the nonlinear characteristics of the speaker. When the distortion sound of the source speaker is not close to the distortion sound of the target speaker, the simulated sound characteristics of the target speaker is not close to the real sound characteristics of the target speaker.

In fact, most of the audio processor circuits are composed of a filter circuit and a distortion circuit, and belongs to a nonlinear system. This kind of circuit characteristics can be characterized by a combination of at least one filter and a saturation characteristic curve, or a combination thereof.

In view of the drawbacks of the above simulation methods, the object of the present application is to provide a method for simulating the nonlinear characteristic of an audio processor. Currently, the mathematical models that can simulate nonlinear systems including neural network models, fuzzy mathematics, and Wiener-Hammerstein models. For the neural network model, the computation is large and the requirements on CPU is high. For the fuzzy mathematics, the modeling process is complex, resulting that it is difficult to implement in practice. And the Wiener-Hammerstein model is a nonlinear system model consisting of two linear subsystems and a nonlinear subsystem. The model is physically compatible with the characteristics of the audio processor circuit. The algorithm is simple and the amount of computation is small.

Therefore, the present invention uses the Wiener-Hammerstein model to model the characteristics of the target audio processor, and to simulate the sound characteristics of the audio processor through identifying and analyzing the parameters of the model.

SUMMARY OF INVENTION

In view of the drawbacks of the prior art, the object of the present application is to provide an apparatus and a method for simulating the characteristic of an audio processor, a terminal device using the apparatus, and a computer-readable storage medium. With the technical solution of the present invention, the sound characteristic of various audio processors can be simulated and the apparatus can be bring to any place as the user wanted in the future, which brings convenience to the performance of the musician.

It should be noted that, in the description of the present disclosure, the audio processor refers to a sound processing device comprising input circuit and output circuit, and the sound is modified through transferring through the input circuit and the output circuit. Preferably, the audio processor can be a guitar speaker, an effect, an amplifier, a mixer, or a vacuum tube power amplifier.

According to an aspect of the present disclosure, a method for simulating the sound characteristics of the audio processor is provided. The method simulates the sound characteristic of a target audio processor by constructing a nonlinear model. The nonlinear model consists of a pre-filter, a saturation characteristic curve, and a post-filter. A high-level signal is sent to the target sound processor, and the target sound processor correspondingly sends out the first output signal, and then the first output signal is filtered and performed spectrum analysis to acquire the frequency response of the post-filter; And a low-level signal is sent to the target sound processor, and the target sound processor correspondingly sends out the second output signal, and then the second output signal is filtered and performed spectrum analysis to obtain a frequency response product of the pre-filter and the post-filter.

According to another aspect of the present disclosure, an apparatus for simulating the sound characteristics of the audio processor is provided. The apparatus simulates the sound characteristic of a target audio processing equipment by constructing a nonlinear model. The nonlinear model consists of a pre-filter, a saturation characteristic curve, and a post-filter. The apparatus comprises a signal generating module, a filtering module, and a spectrum analyzing module. The signal generating module is configured to send high-level signals and low-level signals to the target audio processor, and the target audio processor sends out the first output signal and the second output signal respectively. The filtering module filters the obtained first output signal and the second output signal. The spectrum analyzing module performs frequency spectrum analysis to the filtered first output signal and the second output signal to acquire the frequency response of the post-filter and the frequency response product of the pre-filter and the post-filter respectively.

According to another aspect of the present disclosure, a terminal device is provided. The terminal device comprises a processor and a memory connected to the processor. The memory is configured to store a computer program comprising program instruction, and the processor is configured to invoke the program instruction to execute the method for simulating the sound characteristics of the audio processor.

According to another aspect of the present disclosure, a computer-readable storage medium stored computer programs is provided. The computer programs is configured to be loaded and executed by a processor to implement the method for simulating the sound characteristics of the audio processor.

Compared with the existing technology, the beneficial effects of the disclosed embodiments of the present invention is as follows:

The invention provides a method for simulating the sound characteristics of an audio processor, and can achieve that simulating the sound characteristic of the target audio processor without depending on the quality of the sound characteristic of the source sound processor. In such a manner, the simulation method is simpler and the simulation precision is higher.

The simulation method of the audio processor of the present invention selects the Wiener-Hammerstein model to perform physical modeling of the nonlinear system. With the circuit characteristics of the Wiener-Hammerstein model is consistent with the actual audio processor circuit, compare with the other modeling methods, the algorithm is simpler, the amount of the computation is smaller, and the analog result is accurate and effective.

The simulation method of the audio processor of the present invention can simulate various kind of audio processor. It not only can realize store sound characteristics of various audio processors in one terminal device, but also the simulation precision is high. In such a manner, instead of carrying out several different audio processors to the live every time, the musicians only need to carry out the terminal device with small size. It is much more convenient for the musicians.

The apparatus for simulating the sound characteristics of the audio processor provided by the present invention can be applied to the mobile terminal, for example, the mobile phone. And the apparatus can be transferred to implement simulating sound characteristics of various audio processor. Since mobile phones have gradually become essential equipment for daily life and have been widely used, there is no additional cost, and it is convenient for the user to operate, and brings great convenience to the sound simulation.

BRIEF DESCRIPTION OF DRAWINGS

In order to more clearly illustrate the embodiments of the present invention, the drawings used in the embodiments will be briefly described below. It should be understood that, the following drawings in the description are only a part of the embodiments of the present invention, which should not be considered as limitation of the scope of the present invention, and any person skilled in the art can obtain other related drawings based on these drawings without any creative work.

DESCRIPTION OF EMBODIMENTS

In order to more clearly illustrate the object, the technique project and the characteristics of the embodiments of the present invention, the technical solutions in the embodiments of the present will be clearly and fully described with the accompanying drawings of the embodiments of the present invention. Obviously, the following described embodiments in the description are only a part of the embodiments of the present invention, rather than all the embodiments. Accordingly, the following detailed description of the disclosed embodiments provided in the figures are only the selected embodiments of the present disclosure, rather than intended to limit the scope of the disclosure as claimed. Based on the embodiments in the present disclosure, other embodiments without creative effort modified by any person skilled in the art shall fall within the protection scope of the present invention.

Embodiment 1

Figure 1:
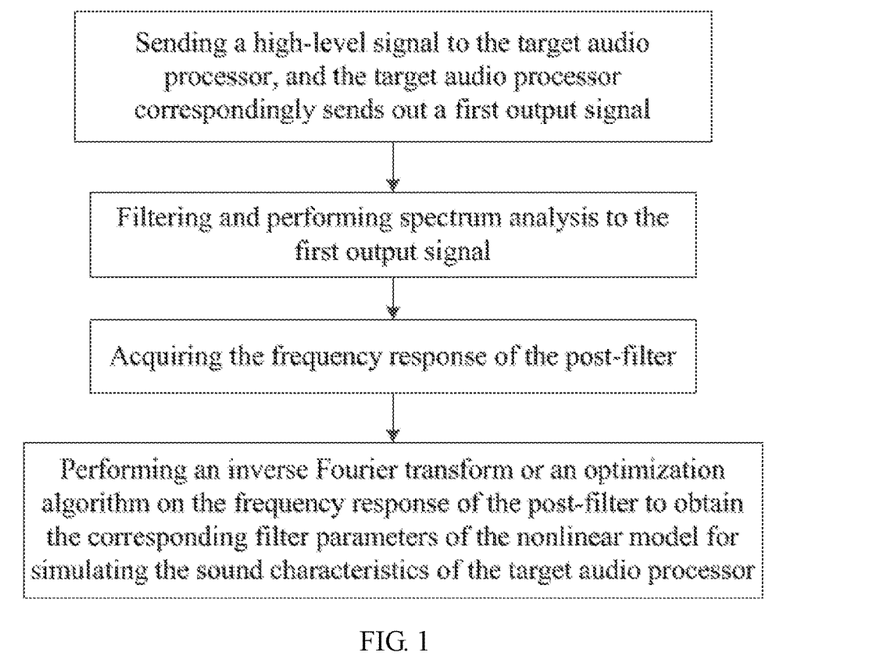
FIG. 1 is a flow chart of a first form of a method for simulating the sound characteristics of the audio processor in accordance with the first embodiment of the present invention.
Figure 2:
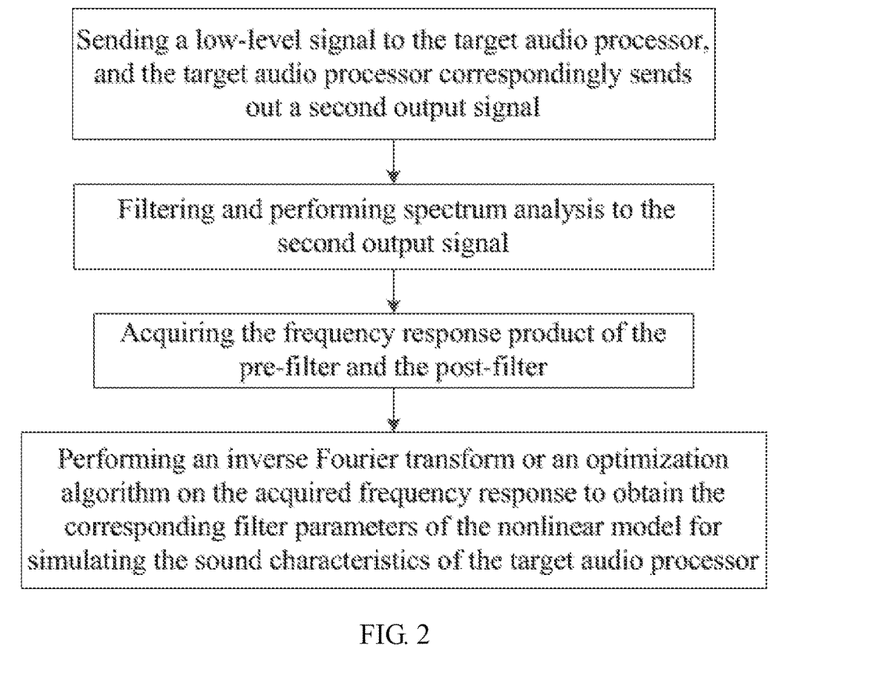
FIG. 2 is a flow chart of a second form of a method for simulating the sound characteristics of the audio processor in accordance with the first embodiment of the present invention.

Referring to FIGS. 1-2, in one aspect, the present embodiment provides a method for simulating the sound characteristics of an audio processor. The method simulates the sound characteristic of a target audio processor by constructing a nonlinear model. The nonlinear model consists of a pre-filter, a saturation characteristic curve, and a post-filter. A high-level signal is sent to the target audio processor, and the target audio processor correspondingly sends out a first output signal, and then the first output signal is filtered and performed spectrum analysis to acquire the frequency response of the post-filter; And a low-level signal is sent to the target audio processor, and the target audio processor correspondingly sends out a second output signal, and then the second output signal is filtered and performed spectrum analysis to obtain a frequency response product of the pre-filter and the post-filter.

Figure 3:
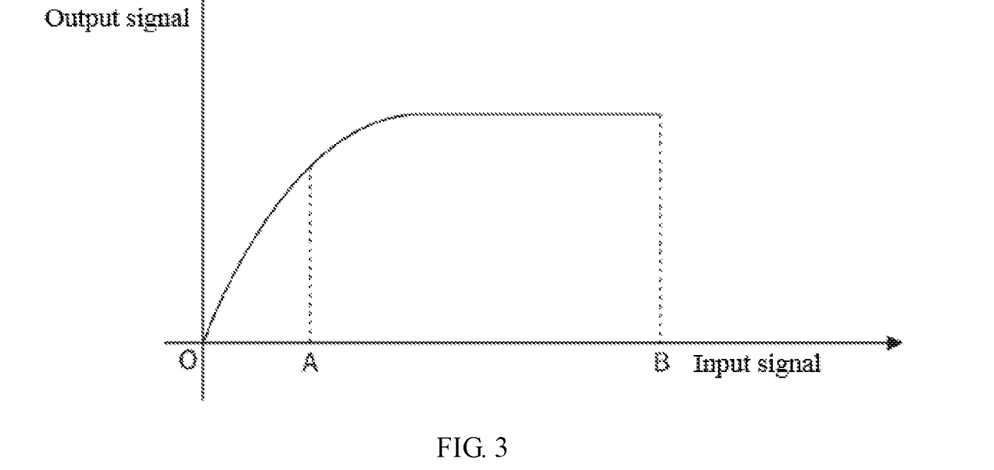
FIG. 3 is the saturation characteristic curve of the method for simulating the sound characteristics of the audio processor in accordance with the first embodiment of the present invention.

Please referring to FIG. 3, one of the characteristics of the saturation characteristic curve is the clipping characteristic of a circuit, such as an electronic tube or a Zener diode. When the voltage is applied to the circuit possessing this characteristic, with the increasing of the input voltage, the output voltage is limited to a certain range.

The other characteristic of the saturation characteristic curve is that it has different gains for different amplitudes of the input signal, in such a manner that when the input signal is a low-level signal, the saturation characteristic curve keeps the target audio processor in a linear region (OA segment shown in FIG. 3), and the parameter of the saturation characteristic curve can be approximated as a constant k. Therefore, when the input signal is a low-level signal, the frequency response of the target audio processor output signal after filtering and frequency spectrum analysis is the frequency response product of the pre-filter and the post-filter. When the input signal is a high-level signal, the saturation characteristic curve keeps the target audio processor in a nonlinear region (AB segment shown in FIG. 3), at which time the saturation curve tends to be saturated, and the frequency response of the pre-filter can be negligible. Therefore, when the input signal is a high-level signal, the frequency response of the target audio processor output signal after filtering and frequency spectrum analysis is the frequency response of the post-filter.

Further, the frequency response of the pre-filter is obtained by combining the frequency response of the post-filter and the frequency response product of the pre-filter and the post-filter.

Preferably, the corresponding filter parameters of the nonlinear model for simulating the sound characteristics of the target audio processor are obtained by performing an inverse Fourier transform or an optimization algorithm on the frequency response of the pre-filter and the post-filter.

Preferably, the high-level signal is a frequency sweep signal, white noise or a composite frequency sine wave.

Preferably, the low-level signal is a frequency sweep signal, white noise or a composite frequency sine wave.

Wherein, when the high-level signal or the low-level signal is a frequency sweep signal, the process of performing frequency spectrum analysis on the output signal of the target audio processor is as follows: directly obtaining a corresponding frequency response; when the high-level signal or the low-level signal is white noise or composite frequency sine wave, the process of performing frequency spectrum analysis on the output signal of the target audio processor is as follows: obtaining a corresponding frequency response by Fourier transforming on the output signal of the target audio processor.

Figure 4:
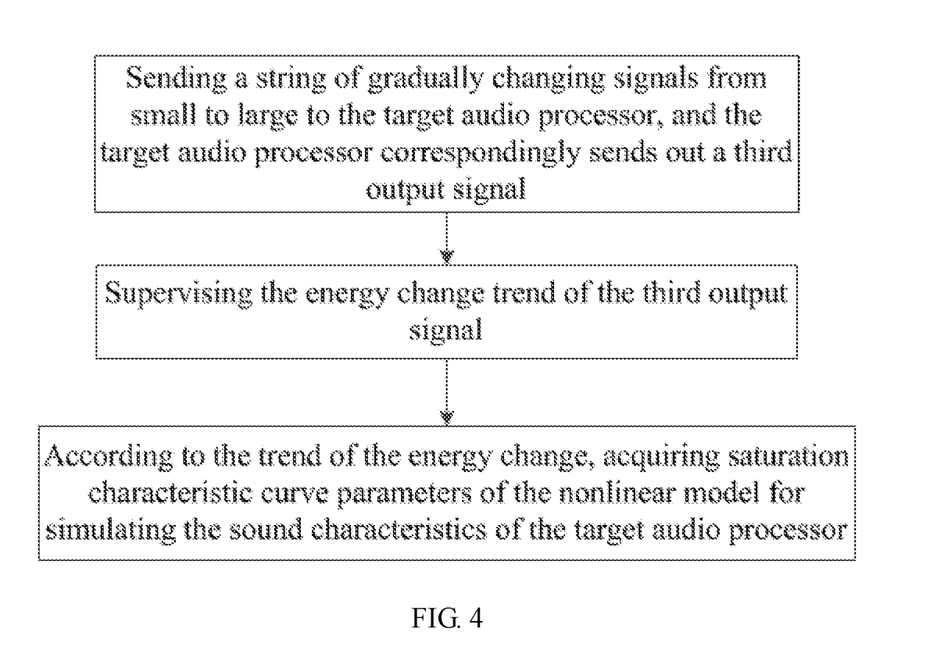
FIG. 4 is a flow chart of a third form of the method for simulating the sound characteristics of the audio processor in accordance with the first embodiment of the present invention.

Further, referring to FIG. 4, a string of gradually changing signals from small to large is sent to the target audio processor, and the target audio processor sends out a third signal, and the energy change trend of the third output signal is monitored. According to the result of monitoring the energy change trend, the saturation characteristic curve parameter of the nonlinear model for simulating the sound characteristics of the target audio processor is obtained.

Further, the sequence of the high-level signal and the low-level signal sent to the target audio processor can be interchangeable.

It should be noted that, in the present invention, whether firstly a high-level signal is sent to the target audio processor, and then the output signal of the target audio processor is filtered and performed frequency spectrum analysis to obtain the frequency response of the post-filter, or firstly a low-level signal is sent to the target audio processor, and then the output signal of the target audio processor is filtered and performed frequency spectrum analysis to obtain the frequency response product of the pre-filter and the post-filter, which does not affect the simulation results of the present invention.

Embodiment 2

Figure 5:
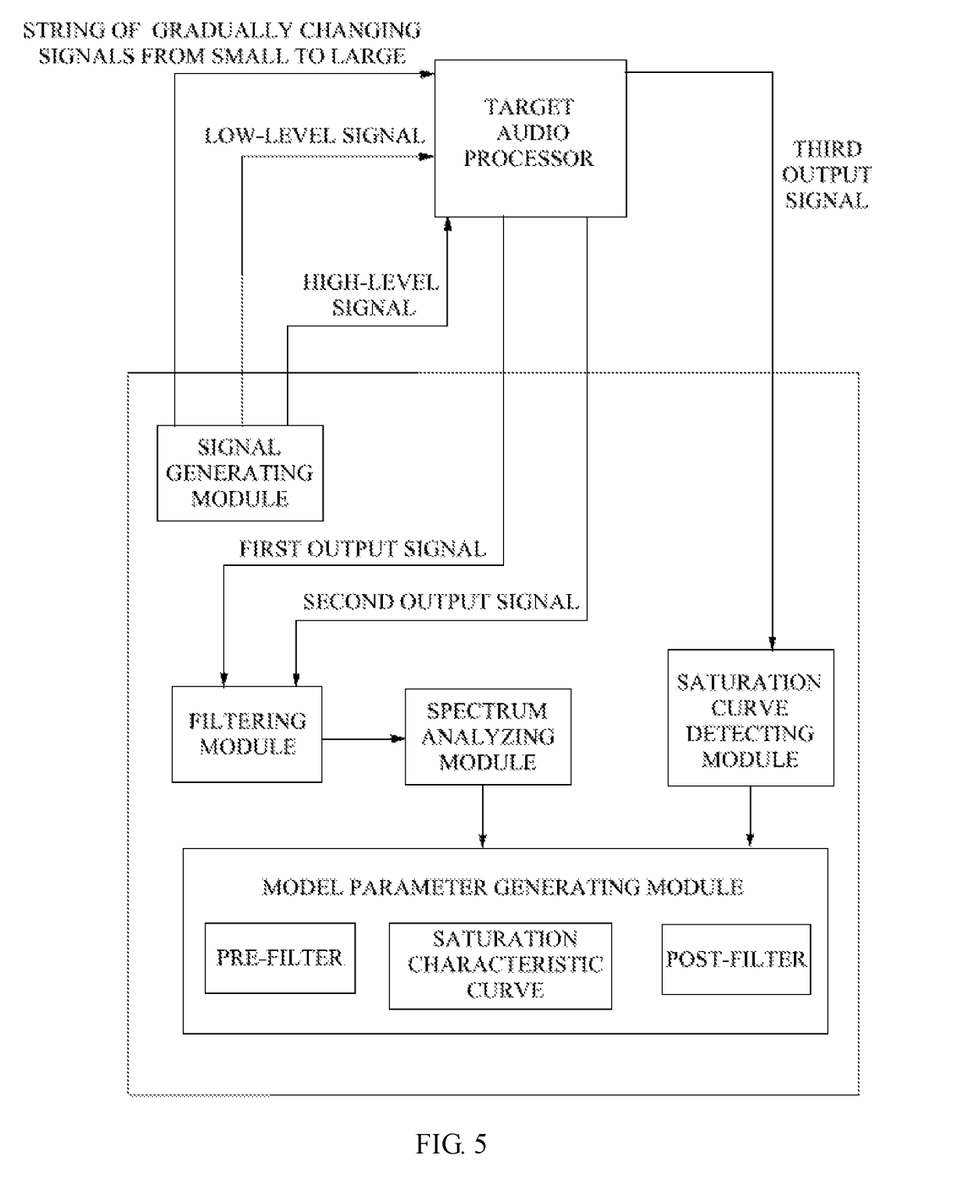
FIG. 5 is a schematic diagram of an apparatus for simulating the sound characteristics of the audio processor in accordance with the second embodiment of the present invention.

Referring to FIG. 5, in this aspect, an apparatus for simulating the sound characteristics of the audio processor is provided. The apparatus simulates the sound characteristic of a target audio processing equipment by constructing a nonlinear model. The nonlinear model consists of a pre-filter, a saturation characteristic curve, and a post-filter. The apparatus comprises a signal generating module, a filtering module, and a spectrum analyzing module. The signal generating module is configured to send high-level signals and low-level signals to the target audio processor, and the target audio processor sends out a first output signal and a second output signal correspondingly. The filtering module filters the received first output signal and the second output signal. The spectrum analyzing module is designed to perform frequency spectrum analysis to the filtered first output signal and the second output signal to acquire the frequency response of the post-filter and the frequency response product of the pre-filter and the post-filter respectively.

Further, the frequency response of the pre-filter is obtained by combining the frequency response of the post-filter and the frequency response product of the pre-filter and the post-filter.

Further, the apparatus further comprises a model parameter generating module. Preferably, the model parameter generating module is configured to obtain the corresponding filter parameters of the nonlinear model for simulating the sound characteristics of the target audio processor by performing an inverse Fourier transform or an optimization algorithm on the frequency response of the pre-filter and the post-filter.

Further, the signal generating module is a signal generating device or a recording device.

Preferably, the high-level signal is a frequency sweep signal, white noise or a composite frequency sine wave.

Preferably, the low-level signal is a frequency sweep signal, white noise or a composite frequency sine wave.

Further, the apparatus further comprises a saturation curve detecting module. The signal generating module sends a string of gradually changing signals from small to large to the target audio processor and the target audio processor sends out a third output signal. The saturation curve detecting module is designed to monitor the energy change trend of the acquired third output signal. According to the result of monitoring energy change, the model parameter generating module obtains the saturation characteristic curve parameters of the nonlinear model for simulating the sound characteristics of the target audio processor.

Further, the sequence of the high-level signal and the low-level signal sent to the target audio processor by the signal generating module can be interchangeable.

It should be noted that, in the actual operation, the arrangement of the different processing modules of the apparatus provided in the above embodiment for simulating the sound of the audio processor is only an example. In actual application, according to the request, the above described processing may be assigned to jointly implement by different program modules. That is, the internal structure of the apparatus for simulating the sound of the audio processor is divided into different program modules, and the different program modules perform all or part of the above described processing. In addition, the apparatus and the method for simulating the sound of the audio processor provided by the above embodiments are in the same concept, and the specific implemented process can refer to the detail description in the above embodiment of the method. It will not be described in detail here.

Embodiment 3

Figure 6:
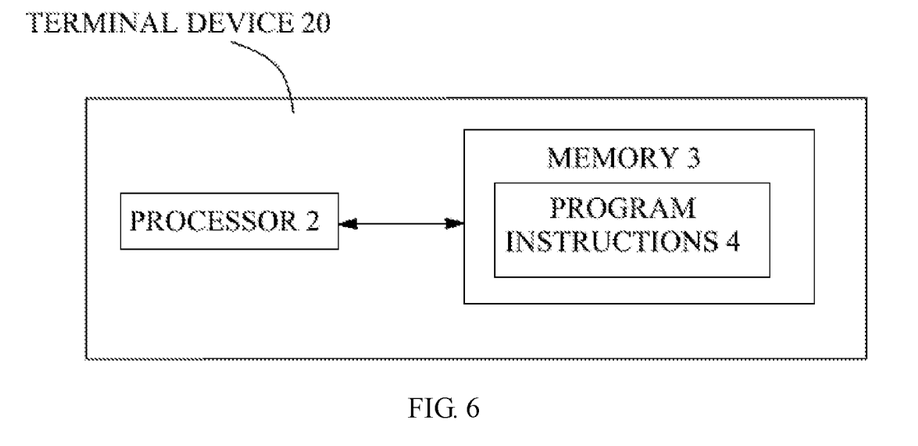
FIG. 6 is a module diagram of a method for simulating the sound characteristics of the audio processor in accordance with the third embodiment of the present invention.

Referring to FIG. 6, in this aspect, in order to implement the above method for simulating the sound characteristics of the audio processor in embodiment 1, a hardware structure adapted to implementing the method for simulating the sound characteristics of the audio processor is provided in this embodiment. The hardware structure is further described as follows. FIG. 6 is a schematic block diagram of the terminal device provided by the present embodiment.

The present embodiment provides a terminal device 1, comprising a processor 2 and a memory 3 connected to the processor 2. The memory 3 is configured to store a computer program comprising program instruction 4, and the processor 2 is configured to invoke the program instruction 4 to execute the method as described in embodiment 1. Alternatively, the processor 2 is configured to invoke the program instruction 4 to execute the functions of the modules/units as mentioned in the foregoing embodiment 2.

In exemplary embodiment, the computer program can be partitioned into one or more modules/units. The one or more modules/units are stored in the memory 3 and executed by the processor 2 to complete present application. The one or more modules/units may be a series of computer program instruction segments being capable of performing a particular function, and the instruction segments is configured to describe the execution process of the executable program in the terminal device 1.

The terminal device 1 may further comprise other unit except the processor 2 and the memory 3. It should be understood that, for any person skilled in the art, the terminal device 1 illustrated in FIG. 6 is only an example and does not constitute a limitation of the terminal device 1. The terminal device 1 may comprise more or less components than those illustrated in FIG. 6, or may combine certain components, or other components. For example, the terminal device may further comprise an input device, an output device, a network access device, a bus, and the like.

The processor 2 may be a central processing unit (CPU), or other general-purpose processor, or a digital signal processor (DSP), or an application specific integrated circuit (ASIC), or Field-Programmable Gate Array (FPGA) or other programmable logic device, discrete gate or transistor logic device, discrete hardware components, etc. The general-purpose processor may be a microprocessor or any conventional processor or the like.

The memory 3 may be an internal storage unit of the terminal device 1, such as a hard disk or a memory of the terminal device 1. Obviously, the memory 3 may be an external storage device of the terminal device 1, such as a plug-in hard disk equipped on the terminal device 1, a smart memory card (SMC), a secure digital (SD), flash card and so on. Further, the memory 3 may include both the internal storage unit and an external storage device. The memory 3 is configured to store the computer program, other programs and data required by the terminal device 1. The memory 3 can also be used to temporarily store data that has been or will be output.

Embodiment 4

In this aspect, a computer readable storage medium stored executable computer programs is provided. The executable computer program is configured to be executed by a processor to implement the method for simulating the sound characteristic of the audio processor described in the embodiment 1.

When the integrated modules/units implemented in the form of software functional units and sold or used as independent products, it can be stored in a computer readable storage medium. Based on this theory, all or part of the processes described in the foregoing embodiments of the present application may also be completed by invoking corresponding computer program to control related hardware executing.

Wherein the computer program comprises computer program code. The computer program code may be in the form of source code, object code form, executable file or some intermediate form. The computer readable storage medium can be any entity or device being capable of carrying the computer program code, or a recording medium, or a USB flash drive, or a removable hard disk, or a magnetic disk, or a CD, or a computer memory, or a read-only memory (ROM), or a random access memory (RAM), or electrical carrier signals, or telecommunications signals, or software distribution media and so on. It should be noted that the content contained in the computer readable medium may be appropriately increased or decreased according to the requirements of legislation and patent practice in a jurisdiction, for example, in some jurisdictions, according to legislation and patent practice, the computer readable media does not include be electrical carrier signals and telecommunication signals.

Skilled in the art may understand that the integrated modules/units and algorithm steps of the various foregoing embodiments may be achieved in the form of hardware, or may be achieved by a combination of computer software and electronic hardware. According to the specific application and design constraints of the solution, the execution form of the functions can be decided.

It should be noted: any person skilled in the art can select different methods to implement the described functions for each specific application, but such implementation should not be considered to be beyond the scope of the present application.

In the embodiments provided by the present application, it should be understood that the disclosed terminal device and method may be implemented in other manners. For example, the terminal device embodiments described above are merely illustrative. For example, the division of the modules or units is only a logical function division. In actual implementation, there may be another division manner, such as multiple units or components. It can be combined or integrated into another system, or some features can be ignored or not executed. In addition, the mutual coupling or direct coupling or communication connection shown or discussed may be an indirect coupling or communication connection through some interface, device or unit, and may be in electrical, mechanical or other form.

The units described as separate components may or may not be physically separated, and the components displayed as units may or may not be physical units. That is, they may be located in one place, or may be distributed to multiple network units. According to the products design and needs, partial or all of the units may be selected to achieve the purpose of the solution of the present embodiment.

In addition, each functional unit in each embodiment of the present application may be integrated into one processing unit, or each unit may exist physically separately, or two or more units may be integrated into one unit. The above integrated unit can be implemented in the form of hardware or in the form of a software functional unit.

The above is merely preferred embodiments of the present disclosure, not intended to limit the present disclosure, various modifications and changes to these embodiments are obvious to any person skilled in the art. Any modification, equivalent substitutions and improvements within the spirit and principle of the present disclosure should be included within the scope of protection of the present disclosure.

We claim:

1. A method for simulating sound characteristics of an audio processor, wherein said method simulates the sound characteristic of a target audio processor by constructing a nonlinear model; wherein said nonlinear model consists of a pre-filter, a saturation characteristic curve, and a post-filter; wherein said method comprises the following steps:
a high-level signal is sent to said target audio processor, and said target audio processor correspondingly sends out a first output signal, and then said first output signal is filtered and performed spectrum analysis to acquire the frequency response of said post-filter; and
a low-level signal is sent to said target audio processor, and said target audio processor correspondingly sends out a second output signal, and then said second output signal is filtered and performed spectrum analysis to obtain a frequency response product of said pre-filter and said post-filter.

2. The method for simulating the sound characteristics of an audio processor as claimed in claim 1, further comprising: obtaining a frequency response of said pre-filter by combining said frequency response of said post-filter and said frequency response product of said pre-filter and said post-filter.

3. The method for simulating the sound characteristics of an audio processor as claimed in claim 2, further comprising: obtaining corresponding filter parameters of said nonlinear model for simulating the sound characteristics of said target audio processor by performing an inverse Fourier transform or an optimization algorithm on said frequency response of said pre-filter and said frequency response of said post-filter.

4. The method for simulating the sound characteristics of an audio processor as claimed in claim 1, wherein said high-level signal is a frequency sweep signal, white noise or a composite frequency sine wave.

5. The method for simulating the sound characteristics of an audio processor as claimed in claim 1, wherein said low-level signal is a frequency sweep signal, white noise or a composite frequency sine wave.

6. The method for simulating the sound characteristics of an audio processor as claimed in claim 3, further comprising:
sending a string of gradually changing signals from small to large to said target audio processor, and said target audio processor correspondingly sends out a third output signal;
supervising the energy change trend of said third output signal;
according to the trend of said energy change, acquiring saturation characteristic curve parameters of said nonlinear model for simulating the sound characteristics of said target audio processor.

7. The method for simulating the sound characteristics of an audio processor as claimed in claim 1, wherein the sequence of said high-level signal and said low-level signal sent to said target audio processor is interchangeable.

8. An apparatus for simulating sound characteristics of an audio processor, wherein said apparatus simulates the sound characteristics of a target audio processor by constructing a nonlinear model and said nonlinear model consists of a pre-filter, a saturation characteristic curve, and a post-filter; wherein said apparatus comprises a signal generating module, a filtering module, and a spectrum analyzing module; wherein said signal generating module is configured to send high-level signals and low-level signals to said target audio processor, and said target audio processor sends out a first output signal and a second output signal correspondingly; said filtering module is designed to filter the obtained first output signal and the second output signal; said spectrum analyzing module performs frequency spectrum analysis to the filtered first output signal and the filtered second output signal to acquire the frequency response of the post-filter and the frequency response product of the pre-filter and the post-filter respectively.

9. The apparatus for simulating the sound characteristics of an audio processor as claimed in claim 8, wherein a frequency response of said pre-filter is obtained by combining said frequency response of said post-filter and said frequency response product of said pre-filter and said post-filter.

10. The apparatus for simulating the sound characteristics of an audio processor as claimed in claim 9, wherein said apparatus further comprises a model parameter generating module; and said model parameter generating module is configured to obtain the corresponding filter parameters of said nonlinear model for simulating the sound characteristics of said target audio processor by performing an inverse Fourier transform or an optimization algorithm on the frequency response of said pre-filter and the frequency response of said post-filter.

11. The apparatus for simulating the sound characteristics of an audio processor as claimed in claim 8, wherein said signal generating module is a signal generating device or a recording device.

12. The apparatus for simulating the sound characteristics of an audio processor as claimed in claim 8, wherein said high-level signal is a frequency sweep signal, white noise or a composite frequency sine wave.

13. The apparatus for simulating the sound characteristics of an audio processor as claimed in claim 8, wherein said low-level signal is a frequency sweep signal, white noise or a composite frequency sine wave.

14. The apparatus for simulating the sound characteristics of an audio processor as claimed in claim 10, wherein said apparatus further comprises a saturation curve detecting module; said signal generating module sends a string of gradually changing signals from small to large to said target audio processor and said target audio processor sends out a third output signal; wherein said saturation curve detecting module is configured to monitor the energy change trend of said third output signal; wherein said model parameter generating module is configured to obtain the saturation characteristic curve parameter of said nonlinear model for simulating the sound characteristics of said target audio processor on account of said energy change trend.

15. The apparatus for simulating the sound characteristics of an audio processor as claimed in claim 8, wherein the sequence of said high-level signal and said low-level signal sent to said target audio processor by said signal generating module is interchangeable.

16. A terminal device, comprising a processor and a memory connected to said processor; wherein said memory is configured to store a computer program comprising program instruction;
   wherein said processor is configured to invoke said program instruction to execute the following steps:
   a high-level signal is sent to said target audio processor, and said target audio processor correspondingly sends out a first output signal, and then said first output signal is filtered and performed spectrum analysis to acquire the frequency response of said post-filter; and
   a low-level signal is sent to said target audio processor, and said target audio processor correspondingly sends out a second output signal, and then said second output signal is filtered and performed spectrum analysis to obtain a frequency response product of said pre-filter and said post-filter.

17. The terminal device as claimed in claim 16, wherein said processor is further configured to:
   sending a string of gradually changing signals from small to large to said target audio processor, and said target audio processor correspondingly sends out a third output signal;
   monitoring the energy change trend of said third output signal;
   according to the trend of said energy change, acquiring a saturation characteristic curve parameter of said non-linear model for simulating the sound characteristics of said target audio processor.

18. The terminal device as claimed in claim 16, wherein a frequency response of said pre-filter by combining said frequency response of said post-filter and said frequency response product of said pre-filter and said post-filter is obtained.

19. A non-transitory computer-readable storage medium, wherein which stores computer programs, following the steps below when executed by a processor:
   a high-level signal is sent to said target audio processor, and said target audio processor correspondingly sends out a first output signal, and then said first output signal is filtered and performed spectrum analysis to acquire the frequency response of said post-filter; and
   a low-level signal is sent to said target audio processor, and said target audio processor correspondingly sends out a second output signal, and then said second output signal is filtered and performed spectrum analysis to obtain a frequency response product of said pre-filter and said post-filter.

20. The non-transitory computer-readable storage medium as claimed in claim 19, wherein which further stores computer programs, following the steps below when executed by a processor:
   sending a string of gradually changing signals from small to large to said target audio processor, and said target audio processor correspondingly sends out a third output signal;
   monitoring the energy change trend of said third output signal;
   according to the trend of said energy change, acquiring a saturation characteristic curve parameter of said non-linear model for simulating the sound characteristics of said target audio processor.

* * * * *